(12) United States Patent
Satoh et al.

(10) Patent No.: US 6,670,688 B2
(45) Date of Patent: Dec. 30, 2003

(54) SEMICONDUCTOR DEVICE INCLUDING AT LEAST ONE SCHOTTKY METAL LAYER SURROUNDING PN JUNCTION

(75) Inventors: Katsumi Satoh, Tokyo (JP); Eisuke Suekawa, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/163,996

(22) Filed: Jun. 7, 2002

(65) Prior Publication Data

US 2003/0038333 A1 Feb. 27, 2003

(30) Foreign Application Priority Data

Aug. 22, 2001  (JP) ........................................ 2001-251367

(51) Int. Cl.[7] ........................ H01L 27/095; H01L 29/47; H01L 29/861; H01L 29/93; H01L 31/0312
(52) U.S. Cl. ........................ 257/484; 257/483; 257/481; 257/480; 257/488; 257/471; 257/104; 257/106; 257/77
(58) Field of Search .................... 257/484, 483, 257/481, 480, 488, 471, 104, 106, 77

(56) References Cited

U.S. PATENT DOCUMENTS 3,760,241 A  * 9/1973  Epple ........................ 257/484

FOREIGN PATENT DOCUMENTS

| JP | 55-6875 | 1/1980 | ................ 257/104 |
| JP | 3-185870 | * 8/1991 | ................ 257/484 |

* cited by examiner

Primary Examiner—Steven Loke
(74) Attorney, Agent, or Firm—Oblon, Spivak, McClelland, Maier & Neustadt, P.C.

(57) ABSTRACT

A semiconductor device which can prevent an operation thereof from being uncontrollable to obtain a high reliability, and can be manufactured easily and can reduce a manufacturing cost. A p-type impurity layer containing a p-type impurity in a relatively high concentration is provided as an operation region of a diode in one of main surfaces of a silicon substrate containing an n-type impurity in a relatively low concentration and a plurality of ring-shaped Schottky metal layers are concentrically provided on the main surface of the silicon substrate around the p-type impurity layer with a space formed therebetween to surround the p-type impurity layer. A silicon oxide film is provided on the main surface of the silicon substrate around the p-type impurity layer and an anode electrode is provided on the p-type impurity layer.

6 Claims, 8 Drawing Sheets

SEMICONDUCTOR DEVICE INCLUDING AT LEAST ONE SCHOTTKY METAL LAYER SURROUNDING PN JUNCTION

BACKGROUND OF THE INVENTION

1. Field of the Invention

The present invention relates to a semiconductor device, and more particularly to a semiconductor device requiring a high breakdown voltage.

2. Description of the Background Art

It is important that a semiconductor device constituted to block a high voltage by a pn junction is to relieve an electric field strength of a junction surface provided in contact with a substance having a different dielectric constant and is to stably implement a breakdown voltage as designed as compared with a junction electric field strength in a silicon substrate.

For this reason, a field limiting ring structure, an SIPOS (Semi-Insulating Polycrystalline Silicon) structure and the like have generally been used as a junction termination processing structure.

<SIPOS Structure>

Figure 13:
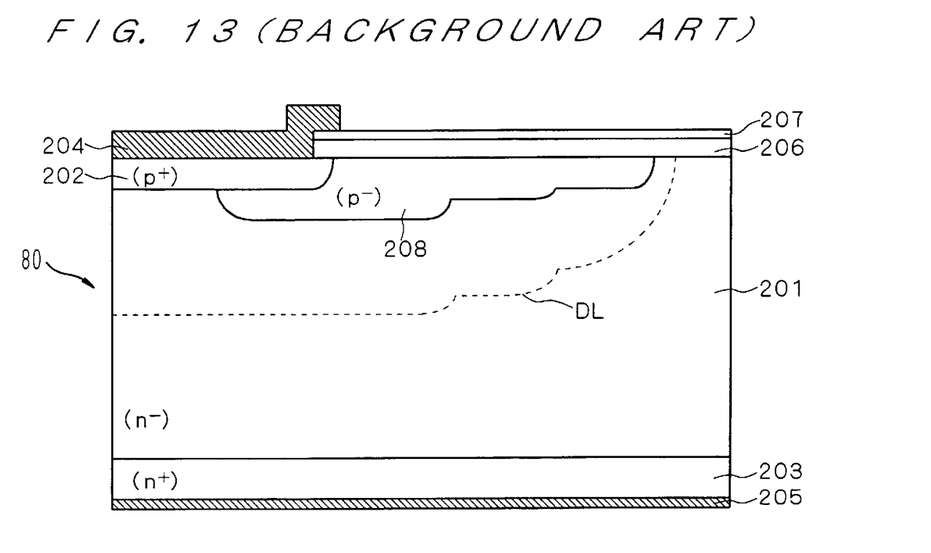
FIG. 13 is a sectional view showing a structure of a conventional semiconductor device using an SIPOS film as a junction termination processing structure.

FIG. 13 shows a sectional structure of a silicon diode 80 having an SIPOS structure as a junction termination processing structure.

As shown in FIG. 13, the silicon diode 80 comprises a p-type impurity layer 202 provided as an operation region of the diode and containing a p-type impurity in a relatively high concentration ($p^+$), and a p-type impurity layer 208 having a part thereof overlapping with an edge portion of the p-type impurity layer 202 and containing the p-type impurity extended in a horizontal direction toward an outer peripheral portion in a relatively low concentration ($p^-$) in one of main surfaces of a silicon substrate 201 containing an n-type impurity in a relatively low concentration ($n^-$).

The p-type impurity layer 208 has a 3-step shape. The steps overlap each other and have the whole shape such that a junction depth and a concentration are reduced toward the outer periphery. The p-type impurity layer 208 is provided to surround the p-type impurity layer 202 on a plane.

A maximum depth of the p-type impurity layer 208 is 20 $\mu$m in a device having a breakdown voltage of 1.2 kV and 70 $\mu$m in a device having a breakdown voltage of 5 kV, for example. Moreover, the p-type impurity layer 202 has a depth of 5 to 40 $\mu$m.

An anode electrode 204 is provided on the p-type impurity layer 202 and an SIPOS film 206 is provided from an upper part of the p-type impurity layer 208 to an upper part of the outer peripheral portion, and a silicon nitride film ($Si_3N_4$) 207 is provided on the SIPOS film 206.

The SIPOS film 206 has a thickness of 500 $\mu$m and contains 10% of oxygen, for example. Moreover, the silicon nitride film 207 has a thickness of 150 nm.

An n-type impurity layer 203 containing an n-type impurity in a relatively high concentration ($n^+$) is provided in the other main surface of the silicon substrate 201 and a cathode electrode 205 is provided on the n-type impurity layer 203.

Thus, the p-type impurity layer 208 having the 3-step shape is provided to surround the operation region of the diode. Therefore, a depletion layer DL is extended during the operation of the device so that an electric field of a pn junction portion can be relieved and a breakdown voltage can be maintained.

In the case in which a backward voltage is applied to the silicon diode 80, a current flows to the SIPOS film 206 so that the SIPOS film 206 can stabilize an electric field distribution of the semiconductor substrate 201.

Moreover, the silicon nitride film 207 functions as a protective film, thereby contributing to stable maintenance of the breakdown voltage.

Figure 14:
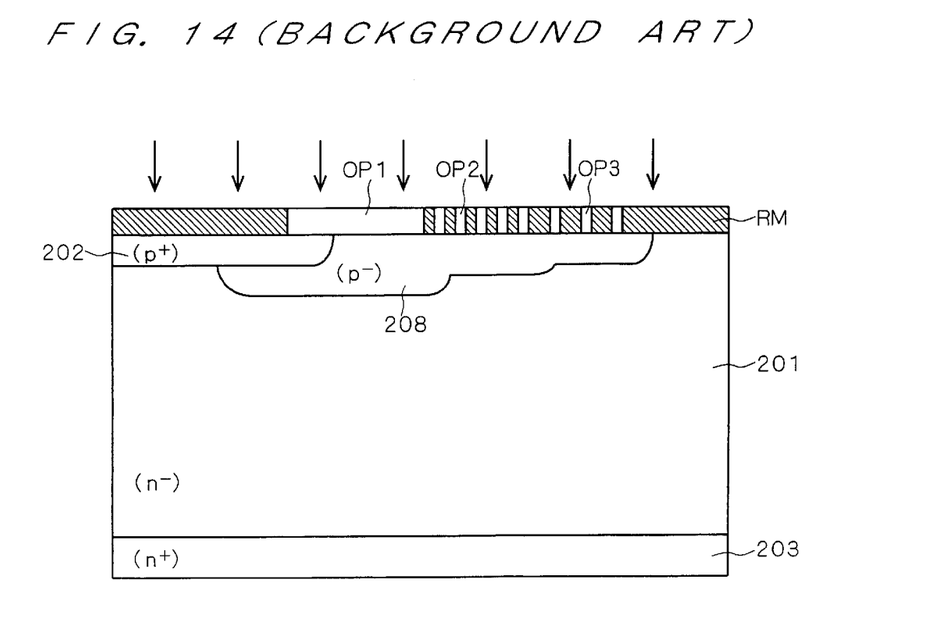
FIG. 14 is a sectional view illustrating a process for manufacturing the conventional semiconductor device using the SIPOS film as the junction termination processing structure.

Next, a method of forming the p-type impurity layer 208 will be described with reference to FIG. 14. As shown in FIG. 14, the p-type impurity layer 202 is formed in one of the main surfaces of the silicon substrate 201 and a resist mask RM is then subjected to patterning on the main surface of the silicon substrate 201.

The resist mask RM has such a pattern that an opening OP1 having a large area corresponding to an area of the deepest diffusion layer is provided on the same diffusion layer in the p-type impurity layer 208 having three steps, and a plurality of openings OP2 are provided on two other diffusion layers and the number of the openings OP2 is decreased when a diffusion depth is reduced.

By using the resist mask RM having such a structure for an ion implantation mask, an effective implantation amount can be changed for each diffusion layer and the p-type impurity layer 208 having the 3-step shape can be obtained by thermal diffusion after ion implantation.

<Field Limiting Ring Structure>

Next, a sectional structure of a silicon carbide diode 90 having a field limiting ring structure as a junction termination processing structure will be described with reference to FIG. 15.

Since silicon carbide has a greater energy gap between bands than that of silicon, it has a great thermal stability so that a silicon carbide device can be operated at a high temperature of 1000 K (Kelvin) or less. In addition, the silicon carbide has a high thermal conductivity. Therefore, the silicon carbide device can be provided at a high density.

Moreover, the silicon carbide has a breakdown electric field which is approximately ten times as great as that of silicon. In a conduction blocking state, therefore, the silicon carbide is suitable for a device to be operated on a condition that a high voltage might be generated.

On the other hand, the SIPOS structure has a great temperature dependency. In the silicon carbide diode having a large operating temperature range, therefore, there is a possibility that a voltage blocking capability might be extremely changed at low and high temperatures. Consequently, it is not desirable that the SIPOS structure should be applied to the silicon carbide diode. For this reason, the field limiting ring structure is generally applied to the silicon carbide diode.

Figure 15:
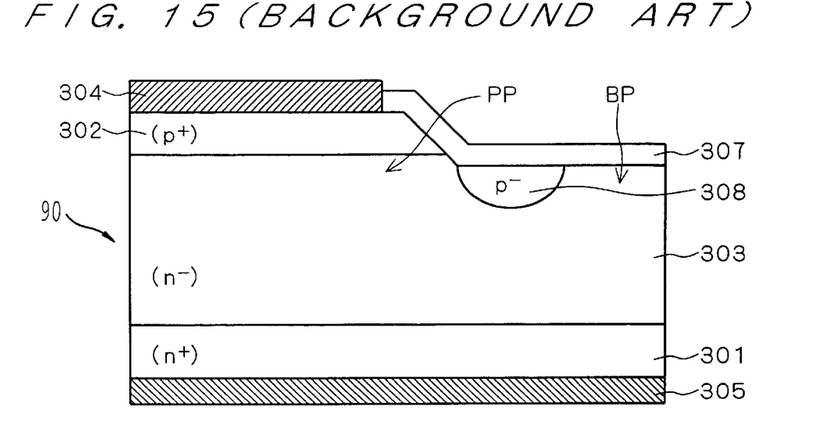
FIG. 15 is a sectional view showing a structure of a conventional semiconductor device using a field limiting ring as the junction termination processing structure.

As shown in FIG. 15, in the silicon carbide diode 90, an n-type epitaxial layer 303 containing an n-type impurity in a relatively low concentration ($n^-$) is provided on one of main surfaces of a silicon carbide substrate 301 containing the n-type impurity in a relatively high concentration ($n^+$).

The n-type epitaxial layer 303 takes a step shape having a protrusion PP and a base bottom portion BP, and a p-type impurity layer 302 containing a p-type impurity in a relatively high concentration ($p^+$) and acting as an operation region of the diode is provided in a surface of the protrusion PP.

A side surface of the protrusion PP is constituted such that a side surface of the n-type epitaxial layer 303 has an inclination with respect to a pn junction interface of the n-type epitaxial layer 303 and the p-type impurity layer 302. Thus, a bevel structure is obtained.

A silicon oxide film 307 is provided from the side surface of the protrusion PP from which a junction end of the pn junction is exposed to a surface of the base bottom portion BP, and the junction end is not directly exposed.

Moreover, the base bottom portion BP is selectively provided with a p-type impurity layer 308 containing a p-type impurity in a relatively low concentration (p⁻) to surround the protrusion PP, thereby constituting a field limiting ring. The field limiting ring is set in a floating state.

An anode electrode 304 is provided on the p-type impurity layer 302 and a cathode electrode 305 is provided on the other main surface of the silicon carbide substrate 301.

Since the field limiting ring 308 is thus provided to surround the operation region of the diode, a high breakdown voltage can be implemented. More specifically, when a backward bias is applied to the diode 90, a depletion layer is first formed around a main junction. When the backward bias is increased, the depletion layer is extended toward the outer peripheral side and the main junction and the field limiting ring punch through before avalanche breakdown of the main junction is caused. Consequently, a maximum field effect of a curved portion of the main junction can be relieved and a breakdown voltage can be maintained.

A method of manufacturing the silicon carbide diode 90 will be described below with reference to FIGS. 16 to 24 to be sectional views showing a manufacturing process in order.

Figure 16:
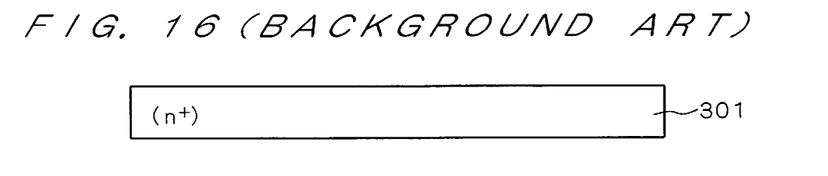
FIGS. 16 to 24 are sectional views showing a process for manufacturing the conventional semiconductor device using the field limiting ring.
Figure 17:
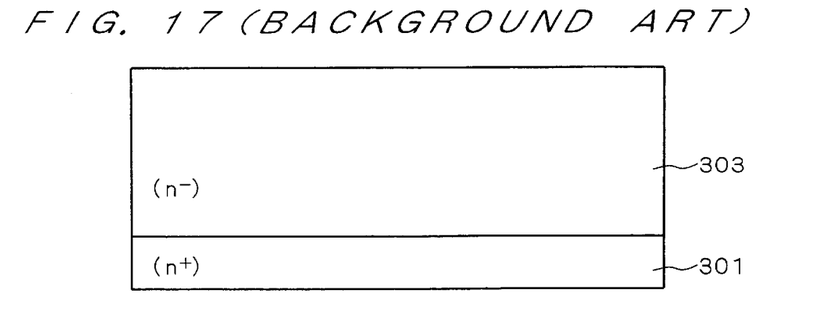

At a step shown in FIG. 16, first of all, a silicon carbide substrate 301 containing an n-type impurity in a relatively high concentration (n⁺) is prepared and silicon carbide is grown on one of main surfaces by an epitaxial growth method to form an n-type epitaxial layer 303 having an impurity concentration of $8 \times 10^{14}$ cm⁻³ (FIG. 17). The n-type epitaxial layer 303 has a thickness of approximately 50 μm.

Figure 18:
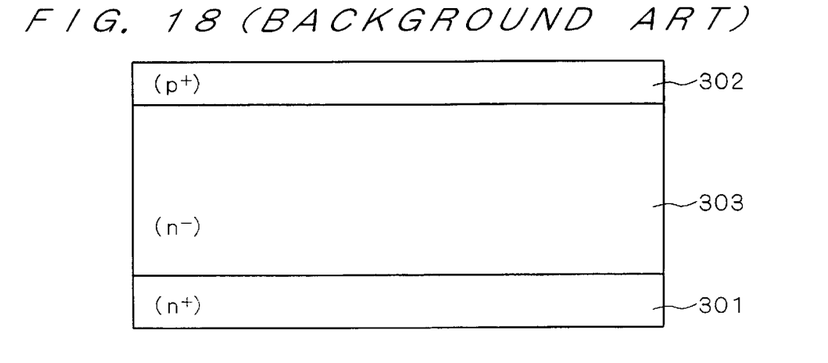

At a step shown in FIG. 18, next, a p-type impurity ion is implanted into a main surface of the n-type epitaxial layer 303 to form a p-type impurity layer 302 containing a p-type impurity in a relatively high concentration (p⁺) by thermal diffusion.

Figure 19:
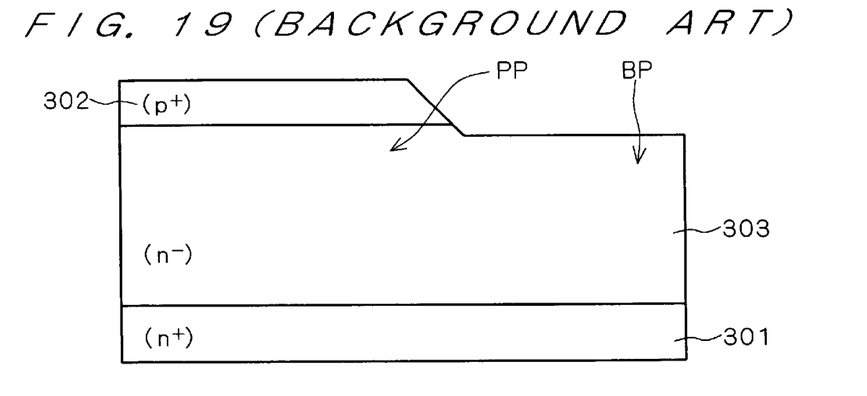

At a step shown in FIG. 19, then, the p-type impurity layer 302 provided on the outer periphery of the operation region is removed by using a photolithographic technique and an anisotropic etching technique such that the p-type impurity layer 302 remains only in a portion to be the operation region. At this time, a part of the n-type epitaxial layer 303 is removed together such that a step shape having a protrusion PP and a base bottom portion BP is formed.

The protrusion PP has a bevel structure in which a side surface thereof is formed with an inclination and a side surface of the n-type epitaxial layer 303 has an inclination with respect to a pn junction interface of the n-type epitaxial layer 303 and the p-type impurity layer 302 remaining in the operation region.

Figure 20:
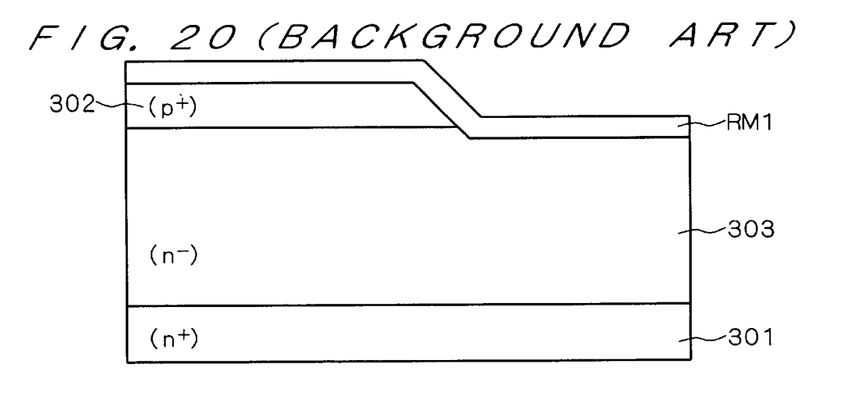
Figure 21:
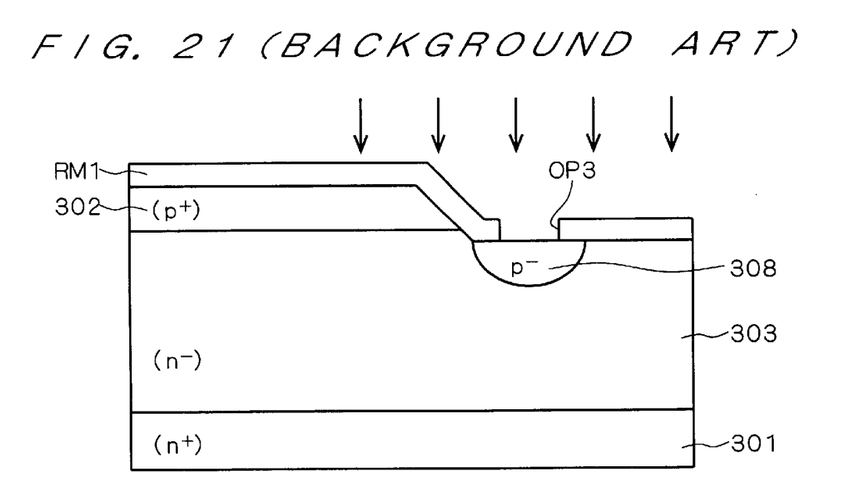

At a step shown in FIG. 20, next, a resist mask RM1 is formed over the whole surface and an opening OP3 is provided to surround the protrusion PP in the resist mask RM1 provided on the base bottom portion BP as shown in FIG. 21. A p-type impurity is implanted into a main surface of the n-type epitaxial layer 303 through the opening OP3 by ion implantation, thereby forming a p-type impurity layer 308 containing the p-type impurity in a relatively low concentration (p⁻).

Figure 22:
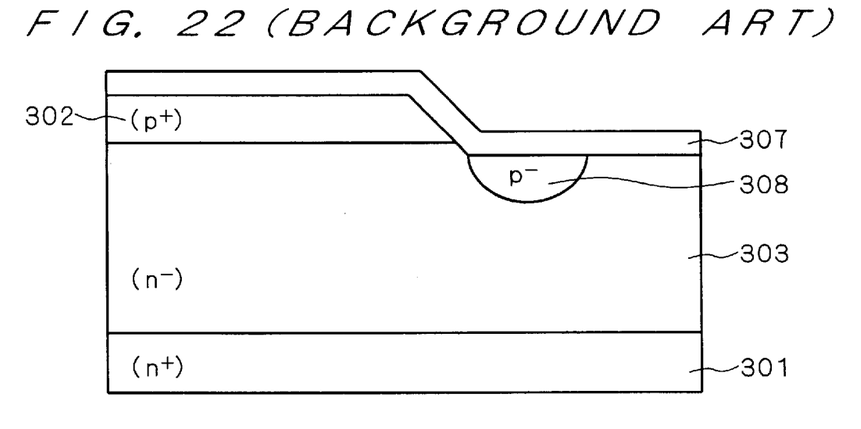

After the resist mask RM1 is removed, a silicon oxide film 307 is formed over the whole surface at a step shown in FIG. 22.

Figure 23:
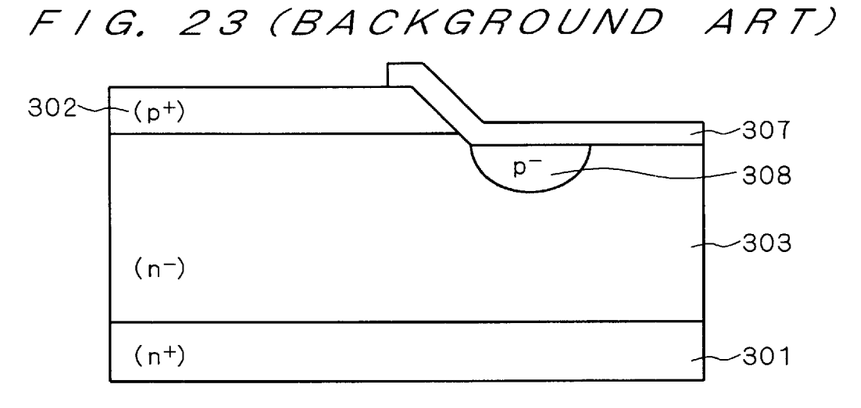

At a step shown in FIG. 23, then, the silicon oxide film 307 is removed such that an upper part of the p-type impurity layer 302 to be the operation region acts as an opening OP4. At this time, the silicon oxide film 307 is selectively removed such that the side surface of the protrusion PP and the base bottom portion BP are reliably covered with the silicon oxide film 307.

Figure 24:
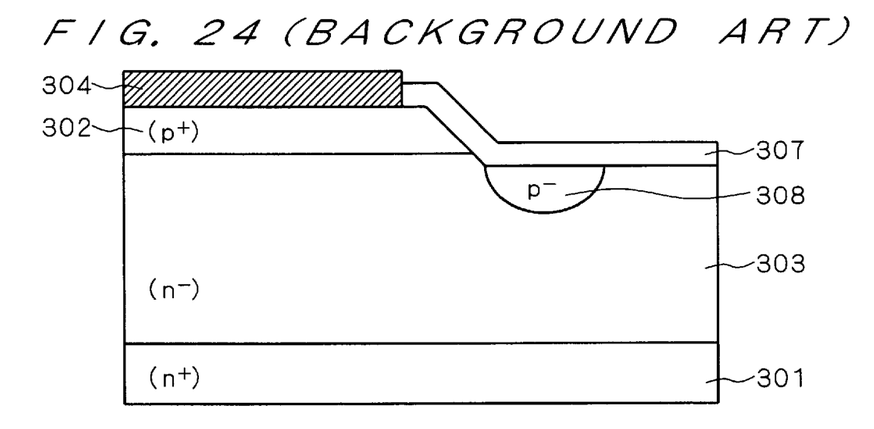

At a step shown in FIG. 24, thereafter, an anode electrode 304 is formed on the p-type impurity layer 302 exposed by the opening OP4. Finally, a cathode electrode 305 is formed on the other main surface of the silicon carbide substrate 301. Consequently, the silicon carbide diode 90 shown in FIG. 15 is obtained.

Although the p-type impurity layer 308 constitutes the field limiting ring, the silicon carbide has a breakdown electric field which is approximately ten times as great as that of silicon. Based on a simple calculation, therefore, it is sufficient that the number of the field limiting rings is one-tenth of that in the case in which the field limiting ring is provided in a silicon device.

While the SIPOS structure or the field limiting ring structure has been employed for the junction termination processing structure in the conventional semiconductor device as described above, there have been the following problems.

More specifically, the conductivity of the SIPOS film has a great temperature dependency and is increased when a temperature is raised. The conductivity is varied by approximately two digits at a room temperature and a temperature of 125° C. Therefore, a voltage blocking capability is varied at the room temperature and the temperature of 125° C. and a leakage current is increased at the temperature of 125° C. Consequently, the temperature is further raised and a leakage current is further increased with a current loss generated by a current leakage at a high temperature. By the positive feedback function, there has been a possibility that the operation of the semiconductor device might be uncontrollable.

Moreover, the conductivity of the SIPOS film is determined by a concentration of contained oxygen. However, it is not easy to control the oxygen concentration with high precision in the manufacturing process.

On the other hand, the impurity concentration and the diffusion depth of the field limiting ring are usually different from those of the main junction in the operation region. The field limiting ring is provided separately from a step of forming the main junction such that an optimum state is brought. However, the manufacturing process becomes complicated and a reduction in a manufacturing cost cannot be attained.

SUMMARY OF THE INVENTION

It is an object of the present invention to provide a semiconductor device in which an operation thereof can be prevented from being uncontrollable to obtain a high reliability, manufacture can be carried out easily and a manufacturing cost can be reduced.

The present invention is directed to a semiconductor device including an underlying semiconductor layer having a region in which a pn junction is to be formed, a junction end of the pn junction reaching a main surface of the underlying semiconductor layer, and at least one Schottky metal layer provided like a ring on the main surface of the underlying semiconductor layer in Schottky contact with the underlying semiconductor layer to surround the region.

The Schottky metal layer is provided like a ring on the main surface of the underlying semiconductor layer in Schottky contact with the underlying semiconductor layer to surround a region in which the pn junction is formed. Therefore, a depleted region having a very low impurity concentration is formed in the main surface of the underlying semiconductor layer to have such a depth as to be almost equal to or greater than a depth of the main junction corresponding to a portion in which the Schottky metal layer is formed. When a backward bias is applied to the semiconductor device, a depletion layer is first formed around the main junction. As the backward bias is increased, the depletion layer is extended toward the outer peripheral side and the main junction and the depleted region punch through before avalanche breakdown of the main junction is caused. Consequently, the depletion layer is expanded to have such a depth as to be almost equal to or greater than the depth of the main junction and is extended toward the outer peripheral side, and a maximum electric field of a curved portion of the main junction can be suppressed and a high breakdown voltage can be obtained. Differently from the case in which a field limiting ring is used as a junction termination processing structure, moreover, it is not necessary to form a dedicated pn junction in the surface of the semiconductor substrate. Consequently, a manufacturing method can be simplified and a manufacturing cost can be reduced. Differently from the case in which an SIPOS film is used for the junction termination processing structure, furthermore, a component having a great temperature dependency is not used. Therefore, even if a rise in a temperature is generated, an operation can be prevented from being uncontrollable. Thus, a semiconductor device having a high reliability can be obtained.

These and other objects, features, aspects and advantages of the present invention will become more apparent from the following detailed description of the present invention when taken in conjunction with the accompanying drawings.

DESCRIPTION OF THE PREFERRED EMBODIMENTS

<A. Structure of Device>

Figure 1:
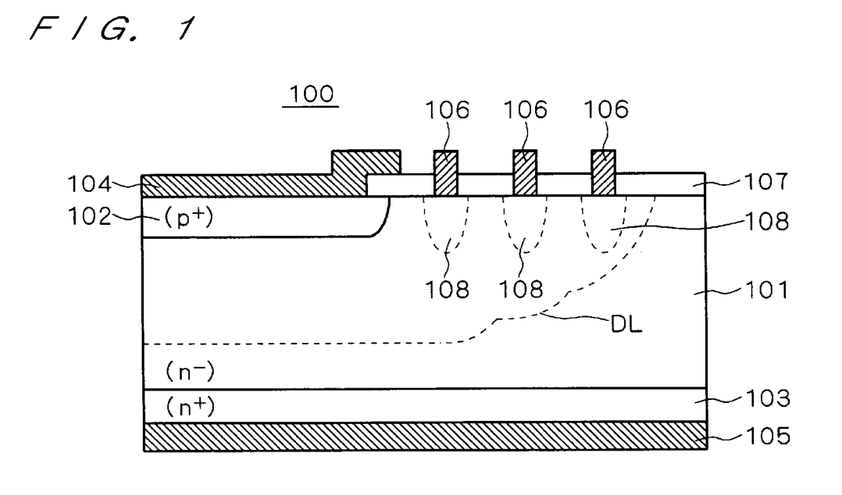
FIG. 1 is a sectional view showing a structure of a semiconductor device according to an embodiment of the present invention.

FIG. 1 shows a sectional structure of a silicon diode 100 according to a first embodiment of the present invention.

As shown in FIG. 1, the silicon diode 100 comprises a p-type impurity layer 102 provided as an operation region of the diode and containing a p-type impurity ($p^+$) in a relatively high concentration in one of main surfaces of a silicon substrate 101 containing an n-type impurity in a relatively low concentration ($n^-$), and a plurality of ring-shaped Schottky metal layers 106 concentrically provided on the main surface of the silicon substrate 101 around a region in which the p-type impurity layer 102 is formed with a space therebetween to surround the p-type impurity layer 102.

A silicon oxide film 107 is provided on the main surface of the silicon substrate 101 around the p-type impurity layer 102 including the Schottky metal layers 106 and an anode electrode 104 is provided on the p-type impurity layer 102.

Moreover, an n-type impurity layer 103 containing an n-type impurity in a relatively high concentration ($n^+$) is provided in the other main surface of the silicon substrate 101 and a cathode electrode 105 is provided on the n-type impurity layer 103. Since the silicon substrate 101, the p-type impurity layer 102 and the n-type impurity layer 103 act as underlying layers of the Schottky metal layer 106, a layer constituted by the layers can be referred to as an underlying semiconductor layer.

With such a structure, the Schottky metal layer 106 comes in Schottky contact with the silicon substrate 101 to form a depleted region 108 having a very low impurity concentration up to such a depth as to be almost equal to or greater than a depth of a main junction in the main surface of the silicon substrate 101.

When a backward bias is applied to the diode 100, a depletion layer is first formed around the main junction. As the backward bias is increased, the depletion layer is extended toward the outer peripheral side and the main junction and the depleted region 108 punch through before avalanche breakdown of the main junction is caused. As shown in FIG. 1, consequently, a depletion layer DL is expanded to have such a depth as to be almost equal to or greater than the depth of the main junction and is extended toward the outer peripheral side so that a maximum electric field of a curved portion of the main junction is suppressed.

<B. Manufacturing Method>

A method of manufacturing the silicon diode 100 will be described below with reference to sectional views of FIGS. 2 to 12 sequentially showing a manufacturing process.

Figure 2:
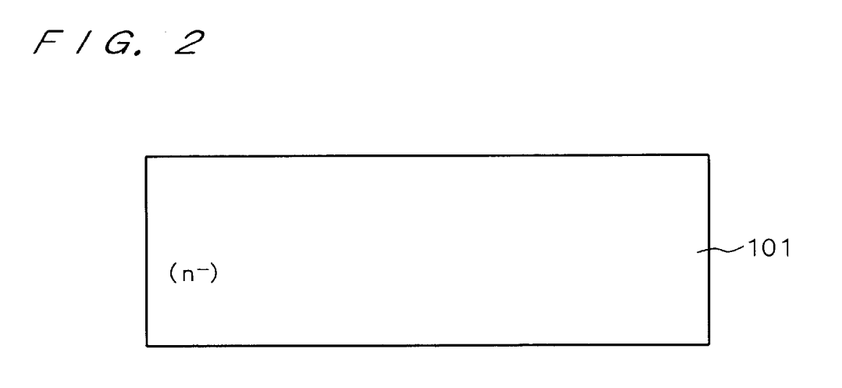
FIGS. 2 to 12 are sectional views showing a process for manufacturing the semiconductor device according to the embodiment of the present invention.
Figure 3:
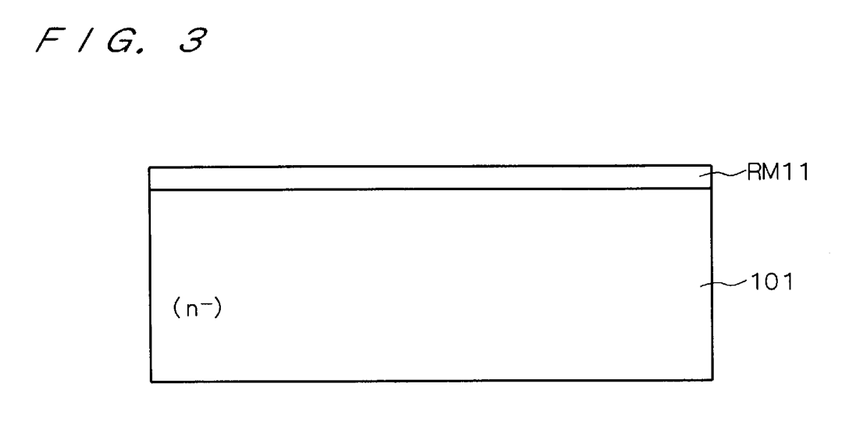

First of all, a silicon substrate 101 containing an n-type impurity in a relatively low concentration ($n^-$) at a step shown in FIG. 2 is prepared and a resist mask RM11 is wholly formed over one of main surfaces of the silicon substrate 101 as shown in FIG. 3.

Figure 4:
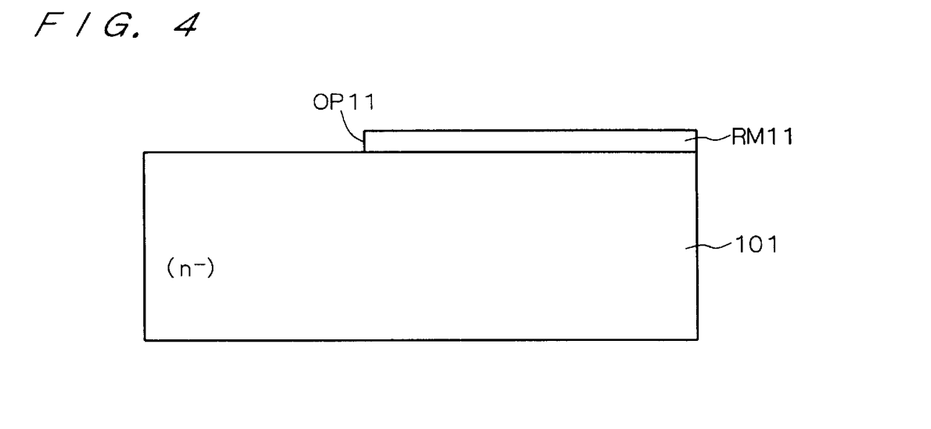
Figure 5:
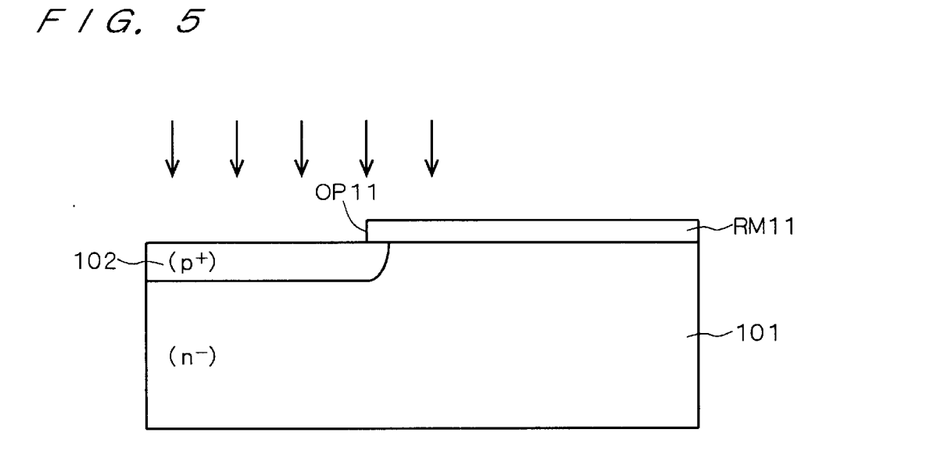

At a step shown in FIG. 4, next, the resist mask RM11 corresponding to a portion to be an operation region is selectively removed to form an opening OP11 corresponding to the operation region. As shown in FIG. 5, a p-type impurity is introduced into the main surface of the silicon substrate 101 through the opening OP11 by ion implantation and is then diffused thermally. Consequently, a p-type impurity layer 102 containing a p-type impurity in a relatively high concentration ($p^+$) is formed in the operation region. The concentration of the p-type impurity layer 102 is determined within the optimization range of the dynamic characteristic of the diode 100 and cannot be defined unconditionally. A surface concentration ranges from $1 \times 10^{16}$ $cm^{-3}$ to $1 \times 10^{19}$ $cm^{-3}$.

Figure 6:
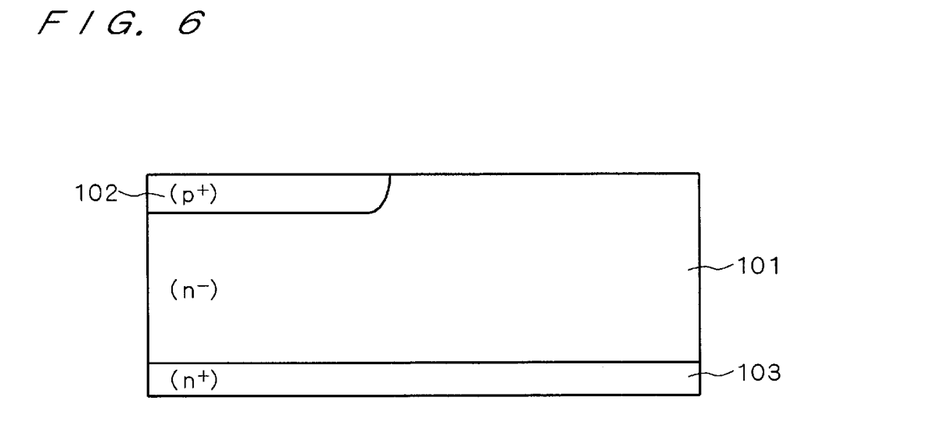

After the resist mask RM11 is removed, an n-type impurity ion is implanted into the other main surface of the silicon substrate 101 and is thermally diffused to form an n-type impurity layer 103 containing an n-type impurity in a relatively high concentration ($n^+$) as shown in FIG. 6. An interface of the n-type impurity layer 103 and the silicon substrate 101 constitutes a pn junction and a junction end thereof reaches the main surface of the silicon substrate 101.

Figure 7:
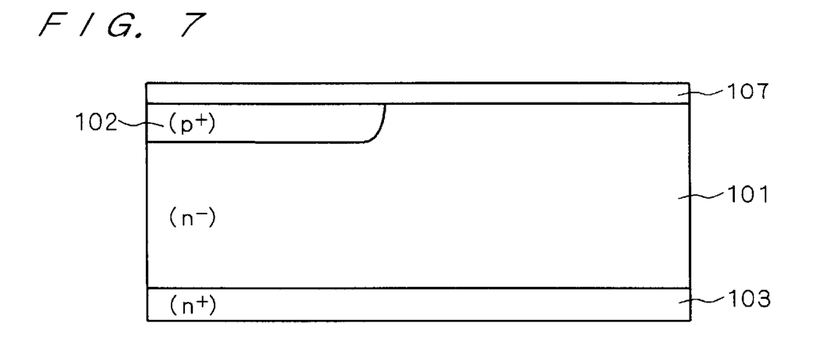

At a step shown in FIG. 7, then, a silicon oxide film 107 is formed by a CVD (chemical vapor deposition) method, for example, over the whole main surface on the side where the p-type impurity layer 102 is formed.

Figure 8:
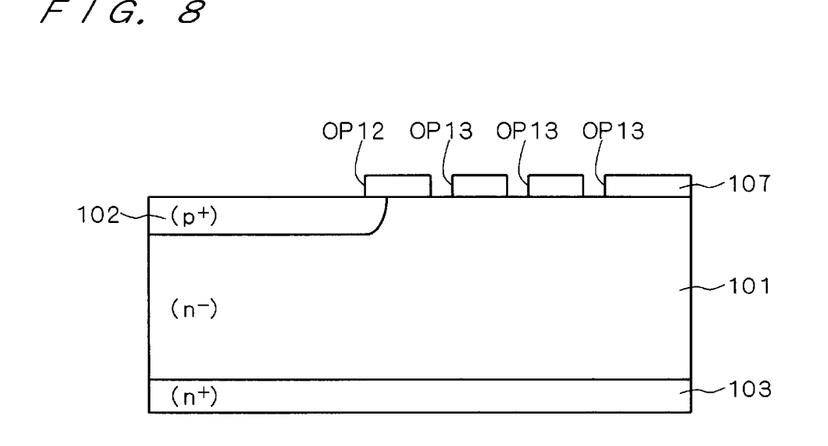

At a step shown in FIG. 8, next, the silicon oxide film 107 is selectively removed by using a photolithographic technique and an anisotropic etching technique so as to form an opening OP12 on the p-type impurity layer 102 to be an operation region and a plurality of ring-shaped openings OP13 to concentrically surround the opening OP12.

Figure 9:
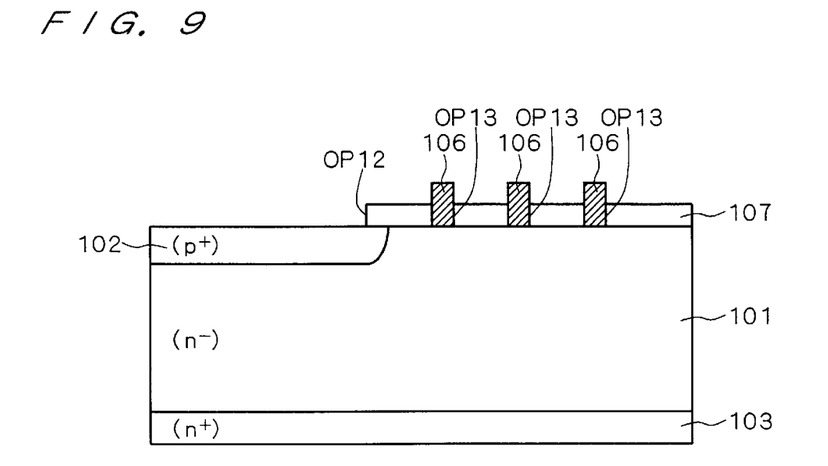

At a step shown in FIG. 9, next, the opening OP13 is filled in and a plurality of ring-shaped Schottky metal layers 106 to come in Schottky contact with the silicon substrate 101 are formed by an evaporation method, for example. More specifically, the Schottky metal layer 106 is formed over the whole surface and is then removed selectively by using the photolithographic technique and the anisotropic etching technique such that the Schottky metal layer 106 remains on only an upper part of the opening OP13. Titanium (Ti) or platinum (Pt) is used for a material of the Schottky metal layer 106.

Figure 10:
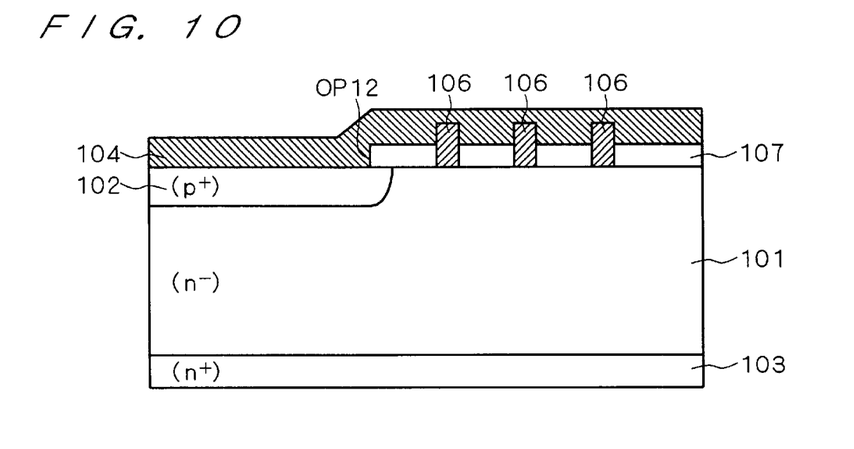

At a step shown in FIG. 10, subsequently, the opening OP12 is filled in and an anode electrode 104 is formed over the whole surface by the evaporation method, for example, including a region in which the Schottky metal layer 106 is formed.

Figure 11:
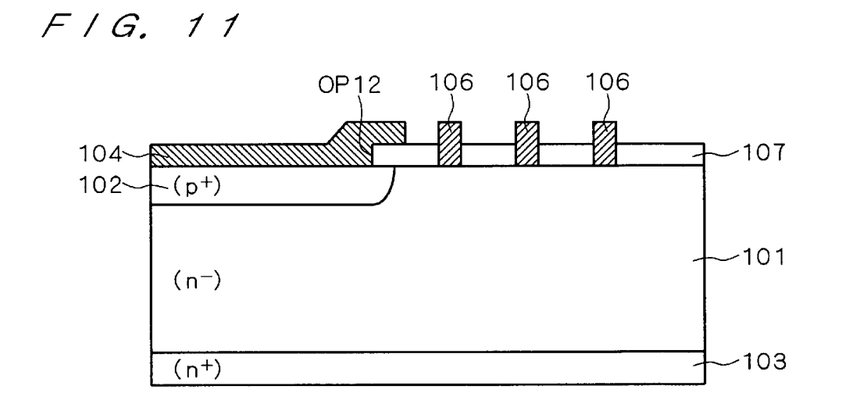

At a step shown in FIG. 11, then, the anode electrode 104 is selectively removed by using the photolithographic technique and the anisotropic etching technique such that the anode electrode 104 remains only in the opening OP12 and on the silicon oxide film 107 in the vicinity of an edge portion of the opening OP12.

Figure 12:
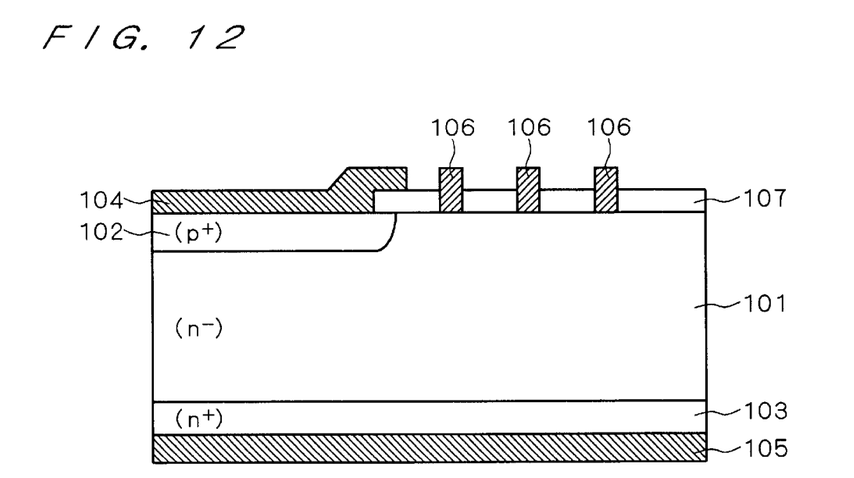

As shown in FIG. 12, finally, a cathode electrode 105 is formed on the n-type impurity layer 103 by the evaporation method, for example. Thus, the silicon diode 100 is completed. Aluminum (Al) or the like is used for a material of the anode electrode 104 and a multilayer deposited layer constituted by Al, Ti, nickel (Ni) and gold (Au) or the like is used for a material of the cathode electrode 105.

Each of the ring-shaped Schottky metal layers 106 has the function of maintaining a breakdown voltage of several hundreds V in the silicon substrate 101. Therefore, when a plurality of Schottky metal layers 106 are provided, a higher voltage blocking capability can be maintained.

Moreover, the anode electrode 104 and the Schottky metal layer 106 are electrically isolated from each other through an insulating film such as the silicon oxide film 107 so that a leakage current between a cathode and an anode can be reduced.

Furthermore, the Schottky metal layers 106 are electrically isolated from each other through the insulating film such as the silicon oxide film 107 and an end face of the depleted region 108 is covered with the insulating film such as the silicon oxide film 107 so as not to be exposed to the main surface of the silicon substrate 101. Consequently, the leakage current between the cathode and the anode can be reduced.

In place of the silicon oxide film 107, a semi-insulating film such as a silicon nitride film ($Si_3N_4$) may be used. By providing the insulating film or the semi-insulating film, the silicon substrate 101 can be protected from external factors.

<C. Function and Effect>

As described above, in the semiconductor device according to the embodiment of the present invention, the depleted region 108 formed by the Schottky contact of the Schottky metal layer 106 provided like a ring to surround the operation region and the silicon substrate 101 is used for the junction termination processing structure.

Accordingly, it is not necessary to form a dedicated pn junction in the surface of the semiconductor substrate differently from the case in which a field limiting ring is used as the junction termination processing structure, and a manufacturing method can be simplified and a manufacturing cost can be reduced.

Differently from the case in which an SIPOS film is used as the junction termination processing structure, moreover, a component having a great temperature dependency is not used. Therefore, even if a rise in a temperature is generated, an operation can be prevented from being uncontrollable. Consequently, a semiconductor device having a high reliability can be obtained.

<D. Variant>

While the silicon diode 100 formed on the silicon substrate 101 has been described in the embodiment according to the present invention, a diode may be fabricated by using a silicon carbide substrate in place of the silicon substrate 101. The same manufacturing method as described above is employed.

In order to maintain a voltage blocking capability with the silicon carbide diode, the field limiting ring is used for the junction termination processing structure as described above. In order to form the field limiting ring on the silicon carbide substrate, however, an ion is implanted with the silicon carbide substrate maintained in a high temperature state differently from the silicon substrate, and activation and thermal diffusion are to be carried out at a temperature of one thousand and several hundreds degrees. If the structure according to the present invention is applied, the Schottky metal layer is provided like a ring over the main surface of the silicon carbide substrate. Therefore, the manufacturing method can be simplified and a silicon carbide diode having a high voltage blocking capability can be provided easily.

While the diode has been taken as an example of a semiconductor device in the above description, the present invention is not restricted to the diode but can be applied to all semiconductor devices such as a MOS transistor or an IGBT (insulated gate bipolar transistor). In short, in the case in which a base layer, an emitter layer, a collector layer, a source—drain layer or the like is formed in a main surface of an underlying semiconductor layer, a depletion layer formed by a main junction is extended toward the outer peripheral side, a maximum electric field of a curved portion of the main junction can be suppressed and a breakdown voltage can be increased if a ring-shaped Schottky metal layer is provided on the main surface of the underlying semiconductor layer around a region in which the layers are formed.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   an underlying semiconductor layer having a region in which a pn junction is to be formed, a junction end of said pn junction reaching a main surface of said underlying semiconductor layer; and
   at least one Schottky metal layer provided like a ring on said main surface of said underlying semiconductor layer in Schottky contact with said underlying semiconductor layer to surround said region and to form a depleted region up to such a depth as to be almost equal to or greater than a depth of a bottom surface of said pn junction in the main surface of the underlying semiconductor layer.

2. The semiconductor device according to claim 1, wherein said at least one Schottky metal layer is a plurality of Schottky metal layers, and wherein said plurality of Schottky metal layers are concentrically provided with a space formed therebetween.

3. The semiconductor device according to claim 1, wherein said underlying semiconductor layer includes:

a first semiconductor layer; and a second semiconductor layer having a different conductivity type which is provided in a main surface of said first semiconductor layer, said pn junction is constituted by an interface of said first semiconductor layer and said second semiconductor layer, said semiconductor device further comprising:

a main electrode which is provided in contact with a surface of said second semiconductor layer exposed to said main surface of said first semiconductor layer and to which a main current of said semiconductor device flows; and an insulating film or a semi-insulating film provided on said main surface of said first semiconductor layer between said main electrode and said at least one Schottky metal layer.

4. The semiconductor device according to claim 3, wherein said at least one Schottky metal layer is a plurality of Schottky metal layers, wherein said plurality of Schottky metal layers are concentrically provided with a space formed therebetween, and wherein said insulating film or said semi-insulating film is also provided on said main surface of said first semiconductor layer between said Schottky metal layers.

5. The semiconductor device according to claim 3, wherein said first semiconductor layer is an n-type semiconductor layer, said second semiconductor layer is a p-type semiconductor layer, and said main electrode is an anode electrode, said semiconductor device further comprising:

a cathode electrode provided on a main surface opposite to said main surface of said first semiconductor layer.

6. The semiconductor device according to claim 1, wherein said underlying semiconductor layer comprises a silicon carbide layer.

* * * * *